(12) United States Patent
Zhou

(10) Patent No.: US 8,822,333 B2
(45) Date of Patent: Sep. 2, 2014

(54) METHOD OF MANUFACTURING A TUNGSTEN PLUG

(71) Applicant: Shanghai Huali Microelectronics Corporation, Shanghai (CN)

(72) Inventor: Jun Zhou, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/706,576

(22) Filed: Dec. 6, 2012

(65) Prior Publication Data
US 2013/0316532 A1    Nov. 28, 2013

(30) Foreign Application Priority Data

May 22, 2012    (CN) .......................... 2012 1 0158832

(51) Int. Cl.
*H01L 21/44*    (2006.01)
*H01L 21/768*    (2006.01)

(52) U.S. Cl.
CPC ................................ *H01L 21/76843* (2013.01)
USPC ............................. 438/653; 438/692; 438/780

(58) Field of Classification Search
None
See application file for complete search history.

(56) References Cited

U.S. PATENT DOCUMENTS

| | | | | |
|---|---|---|---|---|
| 5,990,004 A * | 11/1999 | Yang et al. | .................... | 438/648 |
| 6,426,304 B1 * | 7/2002 | Chien et al. | .................... | 438/727 |
| 6,596,640 B1 * | 7/2003 | Fishcer et al. | ................ | 438/692 |
| 6,852,647 B2 * | 2/2005 | Bencher | ........................ | 438/780 |
| 2005/0085072 A1 * | 4/2005 | Kim et al. | ...................... | 438/684 |
| 2008/0286977 A1 * | 11/2008 | Wang et al. | .................... | 438/710 |
| 2009/0137119 A1 * | 5/2009 | Liu et al. | ........................ | 438/675 |
| 2012/0100717 A1 * | 4/2012 | Lii et al. | ......................... | 438/675 |
| 2012/0235273 A1 * | 9/2012 | Chen et al. | ...................... | 257/510 |

FOREIGN PATENT DOCUMENTS

| CN | 1160930 A | 11/1995 |
|---|---|---|
| CN | 1604317 A | 11/2004 |
| CN | 102044484 A | 10/2009 |

\* cited by examiner

*Primary Examiner* — Reema Patel
*Assistant Examiner* — Syed Gheyas
(74) *Attorney, Agent, or Firm* — Myron Greenspan Lackenbach Siegel LLP

(57) ABSTRACT

A method of manufacturing a tungsten plug is described for producing semiconductor integrated circuits. The method protects the dielectric layer from getting damaged and avoids impact from CMP technology on the electrical RC properties of the semiconductor devices by using a high hardness amorphous carbon layer as an advance pattern film (APF) or barrier layer allowing grinding without altering the dielectric layer, to thereby improve the yield of products.

10 Claims, 4 Drawing Sheets

METHOD OF MANUFACTURING A TUNGSTEN PLUG

FIELD OF THE INVENTION

The present invention relates to producing semiconductor integrated circuits, and particularly relates to a method of manufacturing a tungsten plug.

BACKGROUND OF THE INVENTION

As an important part of the semiconductor integrated circuit industry, the contact holes filled by tungsten and then processed by chemical mechanical planarization (CMP) can make a significant effect directly on the resistance-capacitance (RC) of the whole device.

As the sizes of devices become smaller, and the TiN film and the Ti barrier layer between tungsten and the dielectric layer are thinner, it becomes more difficult to control the CMP technology. In this case over-grinding is common which results in significant fluctuations in the thickness of the dielectric layer, and this reduces the stability of the devices and the yield of products.

In 65 nanometer technology, as the sizes of the devices become smaller, amorphous carbon is typically used in the contact holes as a hard mask when etching. It is common to remove the amorphous carbon after finishing the etching, and then subsequent processes can be started. Because the hardness of the amorphous carbon is extremely high, it can be a good stop layer for use with the CMP technology.

SUMMARY OF THE INVENTION

The present invention discloses a method of manufacturing a tungsten plug, wherein the method includes following steps:

Step S1: Successively preparing an etch stop layer and an inter-layer dielectric on a silicon substrate layer; and then depositing an amorphous carbon layer to cover the upper surface of said inter-layer dielectric; depositing a dielectric anti-reflectivity coating to cover the upper surface of said amorphous carbon layer;

Step S2: Etching said dielectric anti-reflectivity coating, said amorphous carbon layer, said inter-layer dielectric and said etch barrier layer to the upper surface of said silicon substrate layer and form a contact hole; wherein said dielectric anti-reflectivity coating is removed, and the exposed amorphous carbon layer is partly removed;

Step S3: Depositing the barrier layer to cover the upper surface of the remaining or residual amorphous carbon layer as well as the bottom and the side walls of said contact hole; then fully fill tungsten in the contact hole; and Step S4: Applying CMP technology to remove a part of the tungsten to the upper surface of the rest of the amorphous carbon layer, and then removing the remaining amorphous carbon layer.

The above method of manufacturing a tungsten plug, wherein said silicon substrate layer is a silicon wafer which has already formed the structure of bottom devices.

The above method of manufacturing a tungsten plug, wherein the range of the thickness of the etch stop layer is 200-500 Å.

The above method of manufacturing a tungsten plug, wherein SiN can be materials of said etch stop layer.

The above method of manufacturing a tungsten plug, wherein the range of the thickness of said etch barrier layer is 2000-8000 Å.

The above method of manufacturing a tungsten plug, wherein said inter-layer dielectric includes a silicon oxide layer with high aspect ratio and another silicon oxide layer prepared by tetraethoxysilane; said silicon oxide layer with high aspect ratio covers the upper surface of said etch barrier layer, and said silicon oxide layer prepared by tetraethyl oxidation silicon covers the upper surface of said silicon oxide layer with high aspect ratio.

The above method of manufacturing a tungsten plug, wherein CMP technology is applied to deposit said amorphous carbon layer and said dielectric anti reflectivity coating.

The above method of manufacturing a tungsten plug, wherein a light resistance is formed in photoetching technology, and then removing the rest light resistance by mixed gas with hydrogen and nitrogen which is oxygen-free after forming a contact hole which is formed in etching technology by grinding the light resistance.

The above method for manufacturing a tungsten plug, wherein Ti and TIN can be used as materials of said barrier layer.

The above method for manufacturing a tungsten plug, wherein removes the rest of said amorphous carbon layer using oxygen-free plasma.

In conclusion, as a result of the use of said technology solution, the present invention relates to a method of manufacturing a tungsten plug; this invention can well protect the dielectric layer from being damaged and impact can be avoided from CMP technology on the RC of devices by using an amorphous carbon layer as the stop layer while grinding, and this can improve the yield of products.

DETAILED DESCRIPTION OF THE PREFERRED EMBODIMENT

Figure 1:
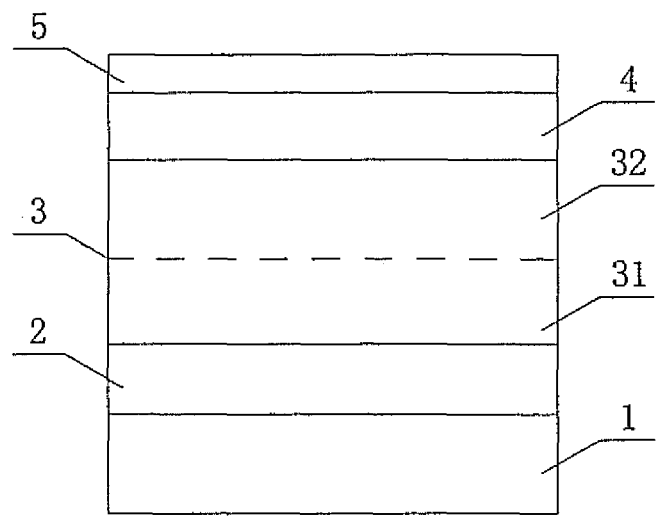
FIG. 1-7 are structural diagrams showing successive stages in the method of manufacturing a tungsten plug in accordance with the invention.

The present invention will be further elaborated in the following with figures, and include the following steps:

Firstly, referring to FIG. 1, a SiN etch stop layer 2 having a thickness in the range of 200-500 Å is grown on the silicon substrate or wafer 1 which has already formed the structure of bottom devices, and then a silicon oxide layer 31 is prepared using a high aspect ratio process (HARP) to cover the upper surface of the silicon nitride etch stop layer 2, and then another silicon oxide layer 32 is prepared using tetraethoxysilane (TEOS) to cover the upper surface of the silicon oxide layer 31. The silicon oxide layer 31 and the silicon oxide layer 32 together make up the inter-layer dielectric (ILD) layer 3 which has a thickness in the range of 2000-8000 Å.

Figure 2:
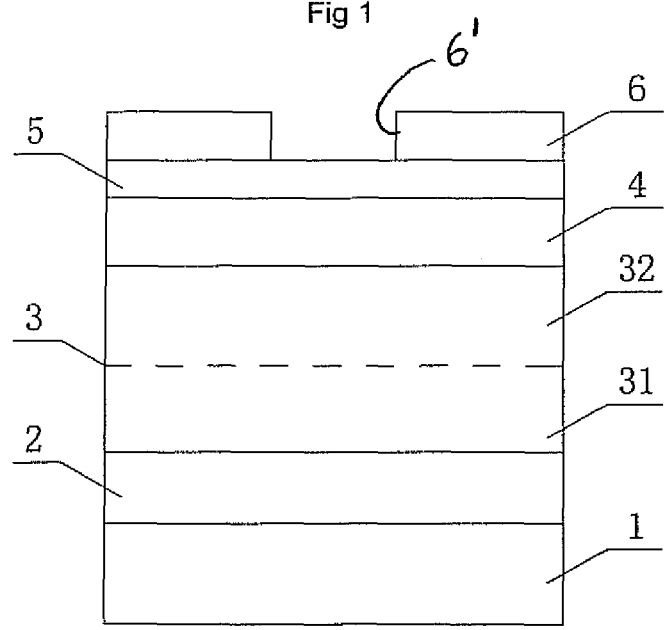

Secondly, referring to FIG. 2, successively depositing an amorphous carbon layer (which is also named as an advance pattern film, APF) 4 and a dielectric anti-reflectivity coating (DARC) 5 using chemical vapor deposition (CVD), and then applying a photoresist layer or coating 6 to cover the upper surface of the DARC 5, removing a selected portion 6' of the photoresist layer or coating 6' for creating the light resistance and formation of a contact hole 7 (FIG. 4) after exposure and development; wherein the APF 4 covers the upper surface of the silicon oxide layer 32 using TEOS, and the DARC 5 covers the upper surface of the APF 4.

Figure 3:
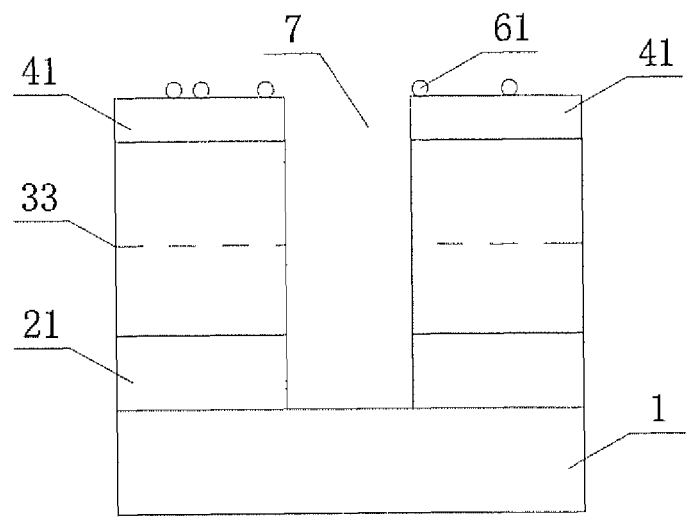

Thirdly, referring to FIG. 3, the DARC 5, the APF 4, the inter-layer dielectric 3 and the etch stop layer 2 are successfully etched to the upper surface of the silicon wafer using the above light resistance of the photoresist layer or coating 6 as a mask, forms the rest APF 41, the rest inter-layer dielectric 33, the rest barrier layer 21 and the contact hole 7. After the above steps, the photoresist layer or coating 6 is removed; wherein the DARC 5 is completely removed during the etching process, the exposed APF 4 is partly etched to form a thinner residual or remaining layer APF 41, and removing the residual or remaining photoresist 61 using mixed gas made up with oxygen-free hydrogen and nitrogen in a stripping and cleaning process.

Figure 4:
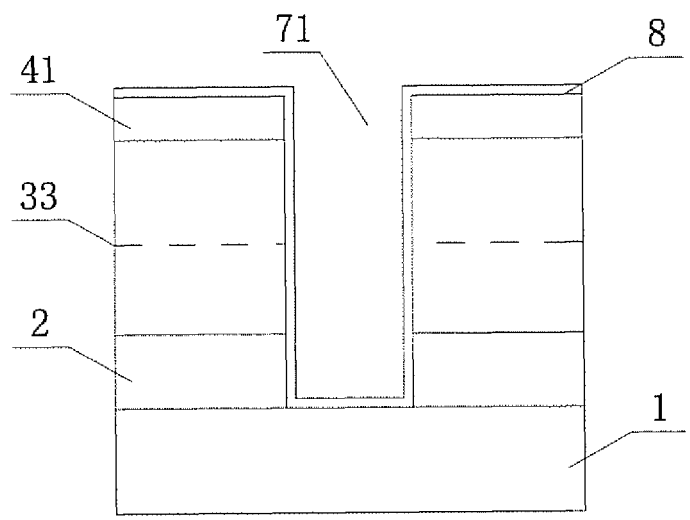
Figure 5:
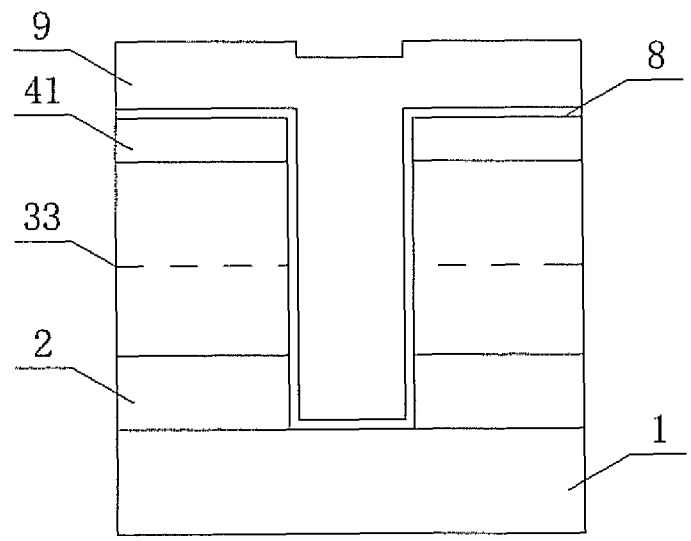

Fourthly, referring to FIG. 4, a barrier layer 8 is deposited which uses Ti and TIN as materials to cover the upper surface of the rest APF 41 as well as the bottom and the side walls of the contact hole 7; and then fully filling metal tungsten 9 in the remaining or modified contact hole 71 to also cover the upper surface of the barrier layer 8 (FIG. 5).

Figure 6:
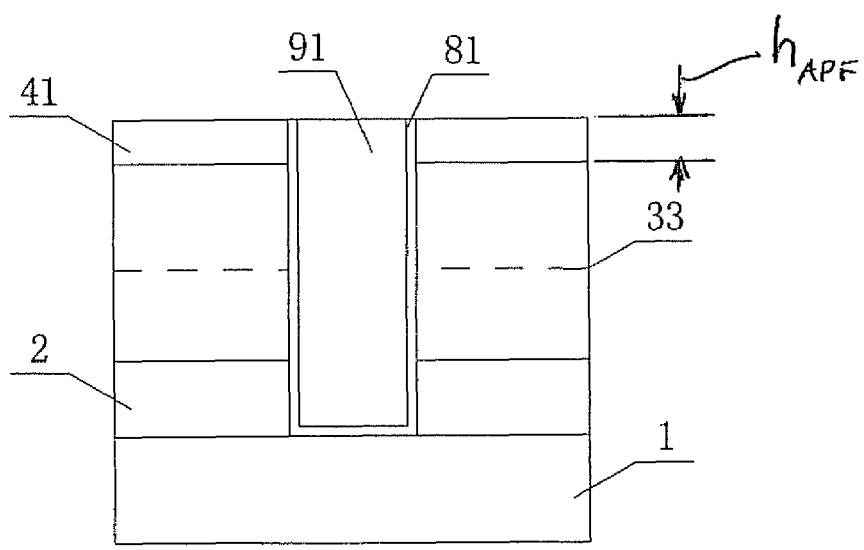
Figure 7:
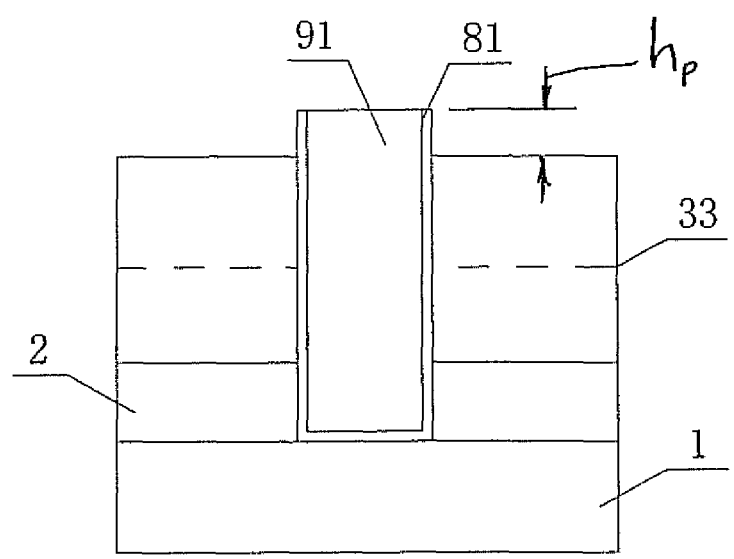

Referring to FIG. 6, the metal tungsten 9 is ground to the residual or remaining APF 41 by CMP technology, removing a part of the metal tungsten 9 and the barrier layer 8 covering the rest APF 41, for manufacturing the rest metal tungsten 91 filling in the contact hole and the rest barrier layer 81; then removing the rest APF 41 using oxygenous plasma as indicated in FIG. 7.

In conclusion, applying the above technical solution, a method for manufacturing a tungsten plug that uses a high hardness APF as an etch stop layer of grinding is proposed in this invention; using the Planarization process, the APF can effectively avoid the dielectric layer damage in the grinding process, and avoid impact from CMP technology on the RC of devices, and thus improve the yield of products.

Although having given a typical embodiment of a particular structure of a specific implementation way with a description and the figures, we can make other changes based on the spirit of this invention. Though preferred embodiments are proposed above, the description of the above typical embodiments is not intended to limit this invention.

It will be obvious to those skilled in the art that numerous changes and modifications can be made after reading the above descriptions. Hence, the Claims attached should be construed to cover all the possible changes and modifications covered by the spirit and scope of this invention. Any and all equivalent contents and ranges in the Claims should be regarded as coming within the spirit and scope of this invention.

The invention claimed is:

1. A method of manufacturing a tungsten plug, comprising the steps of:
    successively preparing an etch stop layer and an inter-layer dielectric (ILD) layer on a silicon substrate layer; and then depositing an advance pattern film (APF) to cover an upper surface of said inter-layer dielectric (ILD) layer; depositing a dielectric anti-reflectivity coating (DARC) to cover said upper surface of said APF;
    etching said dielectric anti-reflectivity coating (DARC), said APF, said inter-layer dielectric (ILD) layer and said etch stop layer to an upper surface of said silicon substrate layer and a photo resist applied to said DARC coating is removed during manufacturing a contact hole; and then said dielectric anti-reflectivity coating (DARC) is removed, and the exposed advance pattern film (APF) is partly removed for creating a thinner remaining APF;
    depositing a barrier layer to cover the upper surface of the remaining advance pattern film (APF) and a bottom and a sidewall of said contact hole; and then fully filling tungsten in the contact hole and cover the upper surface of the barrier layer with tungsten; and
    applying CMP technology to remove a part of the tungsten to the level of the upper surface of the remaining APF, wherein both the top surface of the remaining tungsten filled in the contact hole and the upper surface of the remaining APF lie in the same plane, and then removing said remaining APF so that the top surface of the remaining tungsten filled in the contact hole protrudes from the upper surface of the inter-layer dielectric (ILD) layer.

2. The method of manufacturing a tungsten plug of claim 1, wherein said silicon substrate layer is a silicon wafer which has already formed the structure of bottom devices.

3. The method of manufacturing a tungsten plug of claim 2, wherein the range of the thickness of said etch stop layer is 2000-500 Å.

4. The method of manufacturing a tungsten plug of claim 2, wherein silicon nitride is used as the material of the etch stop layer.

5. The method of manufacturing a tungsten plug of claim 4, wherein the range of the thickness of said inter-layer dielectric is 2000-8000 Å.

6. The method of manufacturing a tungsten plug of claim 4, wherein said inter-layer dielectric includes a silicon oxide layer with high aspect ratio and a silicon oxide layer prepared by tetraethoxysilane; said silicon oxide layer with high aspect ratio covering the upper surface of said etch barrier layer, and said silicon oxide layer prepared by tetraethyl oxidation silicon covers the upper surface of said silicon oxide layer with high aspect ratio.

7. The method of manufacturing a tungsten plug according to claim 1, wherein CVD technology is used to deposit said advance pattern film and said dielectric anti reflectivity coating.

8. The method of manufacturing a tungsten plug according to the claim 7, wherein a photoresist layer is formed for manufacturing a contact hole as an etching mask, and then removing the remaining photoresist by mixed gas with oxygen-free hydrogen and nitrogen.

9. The method of manufacturing a tungsten plug according to the claim 8, wherein Ti and TiN are used as materials for said barrier layer.

10. The method of manufacturing a tungsten plug according to the claim 1, wherein said residual or remaining APF is removed using oxygen-free plasma.

* * * * *